(12) United States Patent
Cheng et al.

(10) Patent No.: US 12,125,783 B2
(45) Date of Patent: Oct. 22, 2024

(54) INTERCONNECT STRUCTURE AND METHOD FOR FORMING THE SAME

(71) Applicant: Taiwan Semiconductor Manufacturing Co., Ltd., Hsin-Chu (TW)

(72) Inventors: Chung-Liang Cheng, Changhua County (TW); Shih Wei Bih, Taichung (TW); Yen-Yu Chen, Taichung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 14 days.

(21) Appl. No.: 18/133,970

(22) Filed: Apr. 12, 2023

(65) Prior Publication Data

US 2023/0253309 A1 Aug. 10, 2023

Related U.S. Application Data

(60) Continuation of application No. 17/156,292, filed on Jan. 22, 2021, now Pat. No. 11,664,308, which is a division of application No. 16/058,290, filed on Aug. 8, 2018, now Pat. No. 10,923,416.

(60) Provisional application No. 62/552,256, filed on Aug. 30, 2017.

(51) Int. Cl.
*H01L 23/522* (2006.01)
*H01L 21/3105* (2006.01)
*H01L 21/311* (2006.01)
*H01L 21/768* (2006.01)
*H01L 21/02* (2006.01)

(52) U.S. Cl.
CPC ...... *H01L 23/5226* (2013.01); *H01L 21/3105* (2013.01); *H01L 21/31105* (2013.01); *H01L 21/76802* (2013.01); *H01L 21/76831* (2013.01); *H01L 21/02164* (2013.01); *H01L 21/02252* (2013.01); *H01L 21/31116* (2013.01); *H01L 21/76843* (2013.01)

(58) Field of Classification Search
None
See application file for complete search history.

(56) References Cited

U.S. PATENT DOCUMENTS

| | | |
|---|---|---|
| 6,326,301 B1 | 12/2001 | Venkatesan et al. |
| 6,362,012 B1 | 3/2002 | Chi et al. |
| 7,795,133 B2 | 9/2010 | Nomura |
| 9,728,490 B2 | 8/2017 | Choi et al. |
| 2004/0106297 A1 | 6/2004 | Kanegae et al. |

(Continued)

FOREIGN PATENT DOCUMENTS

| | | |
|---|---|---|
| CN | 101728314 A | 6/2010 |
| CN | 102598245 A | 7/2012 |

(Continued)

*Primary Examiner* — Hung K Vu
(74) *Attorney, Agent, or Firm* — Duane Morris LLP

(57) ABSTRACT

A semiconductor device includes: a first conductive structure having sidewalls and a bottom surface, the first conductive structure extending through one or more isolation layers formed on a substrate; and an insulation layer disposed between at least one of the sidewalls of the first conductive structure and respective sidewalls of the one or more isolation layers, wherein the first conductive structure is electrically coupled to a second conductive structure through at least the bottom surface.

20 Claims, 9 Drawing Sheets

(56) References Cited

U.S. PATENT DOCUMENTS

| | | | |
|---|---|---|---|
| 2004/0147112 A1* | 7/2004 | Tsu | H01L 21/76807 |
| | | | 257/E21.579 |
| 2006/0019485 A1 | 1/2006 | Komai et al. | |
| 2008/0057700 A1* | 3/2008 | Lee | H01L 21/76814 |
| | | | 438/622 |
| 2008/0150153 A1 | 6/2008 | Enquist | |
| 2009/0085173 A1 | 4/2009 | Boemmels et al. | |
| 2016/0093566 A1* | 3/2016 | Ting | H01L 21/76808 |
| | | | 438/643 |
| 2017/0032975 A1 | 2/2017 | Tai et al. | |

FOREIGN PATENT DOCUMENTS

| | | |
|---|---|---|
| CN | 104620363 A | 5/2015 |
| CN | 105990218 A | 10/2016 |
| CN | 106158827 A | 11/2016 |
| CN | 106206535 A | 12/2016 |
| CN | 106575638 A | 4/2017 |
| CN | 106972015 A | 7/2017 |
| TW | 201643994 A | 12/2016 |

* cited by examiner

INTERCONNECT STRUCTURE AND METHOD FOR FORMING THE SAME

CROSS-REFERENCE TO RELATED APPLICATIONS

This application is a continuation of U.S. patent application Ser. No. 17/156,292, filed Jan. 22, 2021, which is a divisional of U.S. patent application Ser. No. 16/058,290, filed on Aug. 8, 2018, now U.S. Pat. No. 10,923,416, which claims priority to U.S. Provisional Patent Application No. 62/552,256, filed on Aug. 30, 2017, each of which is incorporated by reference herein in its entirety.

BACKGROUND

The semiconductor industry has made significant advancements in its pursuit of higher device density with lower cost. Technological advances in semiconductor device (e.g., integrated circuit (IC)), materials and design have produced progressively smaller and more complex circuits. In the course of semiconductor device evolution, functional density (for example, the number of interconnected devices per chip area) has generally increased while geometry sizes have decreased. This scaling down process generally provides benefits by increasing production efficiency and lowering associated costs However, increased functional density has increased the complexity of semiconductor devices, such as by decreasing the distance between interconnected devices and the number of layers per chip area. Accordingly, there may be a greater chance of failures per chip area during semiconductor processing due at least to the decreased distance between (and increased number of) interconnected devices and/or layers.

Therefore, conventional semiconductor device fabrication and processing are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

DETAILED DESCRIPTION OF EXEMPLARY EMBODIMENTS

Figure 1:
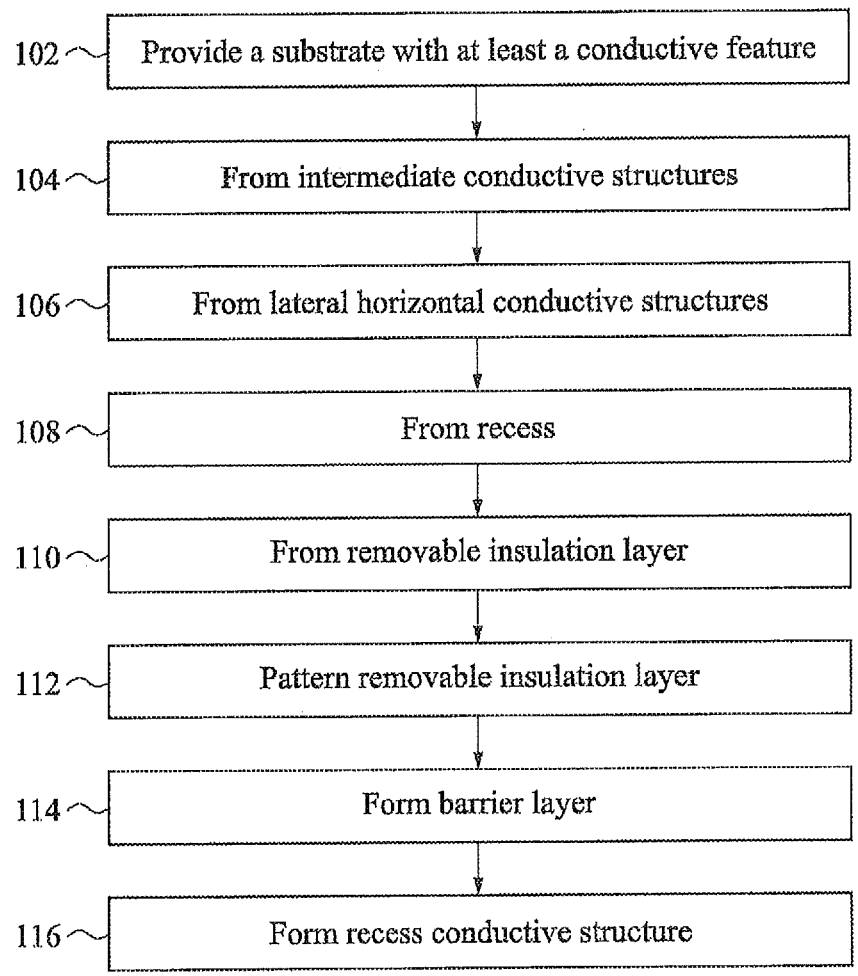
FIG. 1 illustrates a flow chart of an exemplary method for forming a semiconductor device including a removable insulation layer, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of a semiconductor device with a layer of removable insulation for recesses. Recesses may be openings, formed during semiconductor processing, that extend into the semiconductor device and that are to be filled with conductive material to form a conductive element (e.g., a via). The removable insulation layer may be located along sidewalls of the recess (and, accordingly, along sidewalls of the conductive element formed from the recess) to insulate the conductive element from other conductive elements (e.g., to avoid undesirable conductive communication, such as short circuits or cross talk between horizontally adjacent, or lateral, conductive elements).

Also, the removable insulation layer may be more insulating and/or more easily removable than other types of insulation layers (e.g., insulation layers composed of materials such as TiAl or TiN) that may be formed along surfaces of the semiconductor device that may be exposed when forming the recess. In certain embodiments, the removable insulation layer may be formed by exposing a transforming medium to a residual oxide (e.g., an oxide already on the semiconductor device by the time a transforming medium is exposed to the semiconductor device, such as an oxide from an isolation layer's non-conductive material) that reacts with the transforming medium to form the removable insulation layer. Accordingly, by being easily removable (for example, at areas of desirable conductive communication such as interfaces between conductive elements), the removable insulation layer may facilitate desirable conductive communication with conductive elements while insulating conductive elements from undesirable conductive communication, such as short circuits or cross talk.

As will be discussed further below, semiconductor devices may be formed, or processed, on a layer by layer basis, where each layer is deposited and patterned on a preceding layer. These layers (and at least one substrate on which the layers are formed) may include various conductive elements, such as conductive features (e.g., doped wells, voltage sources, or other active devices) that are interconnected via conductive structures (e.g., vias or conductive lines). Stated another way, conductive elements include conductive features and conductive structures, and conductive features are active devices within a semiconductor device that may be interconnected using conductive structures. The conductive elements may include conductive material and the layers may include non-conductive material (e.g., insulating material) which may insulate conductive elements from each other.

In certain embodiments, the removable insulation layer may include a non-conductive material that is deposited (and formed conformally) on a lower layer of the semiconductor device during semiconductor processing (and may be deposited over other non-conductive material of that lower layer). Although the non-conductive materials of the removable insulation layer and the lower layer may be the same, or may be different, the non-conductive material of the removable insulation layer may be formed ad hoc when a recess is formed. Accordingly, conductive material deposited in the recess may be insulated (e.g., conductively insulated) by the non-conductive material of the removable insulation layer even if the newly formed recess cuts through or adjoins a conductive material of a lateral conductive element (as further discussed and illustrated below). To illustrate this point, a lateral conductive element may be exposed from a recess when the recess adjoins the conductive material of the lateral conductive element. Filling the recess with conductive material (without first forming the removable insulation layer over the recess) would yield a short circuit between the conductive material filled in the recess and the conductive material of the lateral conductive element. The removable insulation layer becomes increasingly advantageous for semiconductor processing as the distance between semiconductor devices decrease (due at least in part to the increased functional density discussed above) and the opportunity for errors accordingly increases (due at least to possible manufacturing defects or aberrations from relatively more difficult fabrication control at the smaller sizes).

Also, in some embodiments, the removable insulation layer may be formed by exposing the recess to a transforming medium. The transforming medium may be a medium that forms the removable insulation layer on the surface of the recess in a conformal manner. In certain embodiments, the transforming medium may be a medium that reacts to residual oxide (e.g., an oxide on the semiconductor device, such as an oxide from an isolation layer's non-conductive material) to form the removable insulation layer. For example, the residual oxide may be SiOx, where x is between 1~2, from the non-conductive material of an isolation layer and the transforming medium may be $H_2$ plasma, that (upon being exposed to the residual oxide) reacts and produces the insulation layer as a conformal layer of $SiO_2$ along the recess.

The removable insulation layer may be removed by applying a removal process to the removable insulation layer. In some embodiments, this removal process may include applying a removing medium, such as Argon (Ar) plasma, directionally upon portions of the removable insulation layer. For example, the directional Ar plasma may be applied (directionally, from above the removable insulation layer) to portions of the insulation layer for removal. This directional application may be performed by overlaying a mask on the removable insulation layer to expose the portions of the removable insulation layer for removal and then applying the removing medium to the exposed insulation layer through the mask. Alternatively, the directional application may be performed by direct control of a removing medium expeller to direct the removable medium upon portions of the removable insulation layer for removal (without an intermediate mask that exposes the portions of the removable insulation layer for removal and that hides the other portions of the removable insulation layer not intended for removal).

Advantageously, in various embodiments, the removable insulation layer may be more easily removable and/or provide more insulation than other types of traditional protective layers that may insulate conductive material, such as a layer of TiAl or TiN. For example, application of this removal process may remove the portions of the removable insulation layer faster (greater quantity of material removal per unit time), more effectively (greater percentage of total material removal per unit time), or cheaply (cheaper operation costs per unit time) than traditional removal processes applied to other types of traditional protection layers that may insulate conductive materials. Accordingly, the removable insulation layer may prevent undesirable contact between different conductive elements (e.g., conductive features such as doped wells, voltage sources, gates or other active devices as well as conductive structures such as vias or conductive lines). For example, the removable insulation layer may prevent contact between a gate structure and a conductive line as will be illustrated below.

As will be discussed further below, lateral conductive elements may be adjoined by spacers to space lateral conductive elements from a recess. These spacers may include a non-conductive material and be disposed along parts of the sidewalls of the lateral conductive elements. However, these spacers may not cover the entire cross sectional surface of the lateral conductive element. This may be due to the lateral conductive element being typically configured to couple with (or contact) another conductive element, different than the conductive element being formed from the recess, somewhere within the semiconductor device. Accordingly, the lateral conductive element may not be covered by the spacer on a part of the lateral conductive element used for conductive coupling. Also, as the distance between conductive elements decrease, the size of the spacers may also decrease and become less effective or ineffective in spacing lateral conductive elements from the recess. Furthermore, a recess may be formed that cuts into the lateral conductive element. Therefore, advantageously in certain embodiments, the removable protection layer may be more effective than a spacer at insulating lateral conductive elements from conductive material deposited in a recess.

FIG. 1 illustrates a flowchart of a method 100 to form a semiconductor device according to one or more embodiments of the present disclosure. It is noted that the method 100 is merely an example, and is not intended to limit the present disclosure. Accordingly, it is understood that additional operations may be provided before, during, and after the method 100 of FIG. 1, certain operations may be omitted, and other operations may be only briefly described herein.

In some embodiments, operations of the method 100 may be associated with the cross-sectional views of a semiconductor device at various fabrication stages as shown in FIGS. 2A, 2B, 2C, 2D, 2E, 2F, 2G, and 2H respectively, which will be discussed in further detail below.

Referring now to FIG. 1, the method 100 starts with operation 102 in which a semiconductor substrate with at least one conductive feature is formed. The method 100 continues to operation 104 where intermediate conductive structures (which may be a type of conductive element) are formed within isolation layers that overlay the semiconductor substrate. The method 100 continues to operation 106 where a lateral conductive structure (which may be a type of lateral conductive element) is formed within the isolation layers of the semiconductor device. The method 100 continues to operation 108 where the isolation layers are etched to form a recess in conductive communication with the at least one conductive feature of the semiconductor substrate. The method 100 continues to operation 110 where a removable insulation layer is formed that overlays the recess. The method 100 continues to operation 112 where portions of the removable insulation layer are removed in accordance with a desired pattern (e.g., a mask pattern), such as by being removed at the bottom of the recess. The method 100 continues to operation 114 where a barrier layer is formed along the exposed sidewalls of the recess to overlay the removable insulation layer. The method 100 continues to operation 116 where a recess conductive structure is formed in the recess by filling the recess with conductive material.

As mentioned above, FIG. 2A through FIG. 2H illustrate, in cross-sectional views, respective portions of a semiconductor device 200 at various fabrication stages of the method 100 of FIG. 1. The semiconductor device 200 may include, be included in, or be a microprocessor, memory cell, wafer, and/or other integrated circuit (IC). Also, FIGS. 2A through 2H are simplified for a better understanding of the concepts of the present disclosure. For example, although the figures illustrate the semiconductor device 200, it is understood the IC may comprise a number of other devices such as resistors, capacitors, inductors, fuses, etc., which are not shown in FIGS. 2A-2H, for purposes of clarity of illustration. In certain embodiments, the conductive feature 204 may be a gate or a contact for an active device.

Figure 2A:
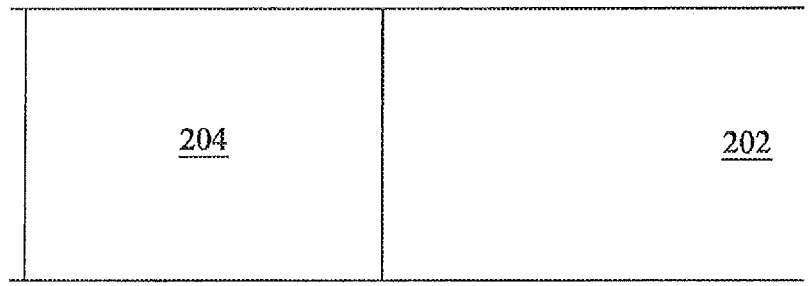
FIGS. 2A, 2B, 2C, 2D, 2E, 2F, 2G, and 2H, illustrate cross-sectional views of an exemplary semiconductor device during various fabrication stages, made by the method of FIG. 1, in accordance with some embodiments.

FIG. 2A is a cross-sectional view of the semiconductor device 200 including a substrate 202 with at least one conductive feature 204 at one of the various stages of fabrication corresponding to operation 102 of FIG. 1, in accordance with some embodiments. Although the semiconductor device 200 in the illustrated embodiment of FIG. 2A includes only one conductive feature (e.g., 204), it is understood that the illustrated embodiment of FIG. 2A and the following figures are merely provided for illustration purposes. Thus, the semiconductor device 200 may include any desired number of conductive features while remaining within the scope of the present disclosure.

In some embodiments, the substrate 202 includes a silicon substrate. Alternatively, the substrate 202 may include other elementary semiconductor materials such as, for example, germanium. The substrate 202 may also include a compound semiconductor such as silicon carbide, gallium arsenic, indium arsenide, and indium phosphide. The substrate 202 may include an alloy semiconductor such as silicon germanium, silicon germanium carbide, gallium arsenic phosphide, and gallium indium phosphide. In one embodiment, the substrate 202 includes an epitaxial layer. For example, the substrate may have an epitaxial layer overlying a bulk semiconductor. Furthermore, the substrate 202 may include a semiconductor-on-insulator (SOI) structure. For example, the substrate may include a buried oxide (BOX) layer formed by a process such as separation by implanted oxygen (SIMOX) or other suitable technique, such as wafer bonding and grinding.

In some embodiments, the substrate 202 also includes various p-type doped regions and/or n-type doped regions, implemented by a process such as ion implantation and/or diffusion. Those doped regions include n-well, p-well, light doped region (LDD), heavily doped source and drain (S/D), and various channel doping profiles configured to form various active devices (or integrated circuit (IC) devices), such as a complimentary metal-oxide-semiconductor field-effect transistor (CMOSFET), imaging sensor, and/or light emitting diode (LED). The substrate 202 may further include other devices (functional features) such as a resistor or a capacitor formed in and on the substrate. The substrate 202 further includes lateral isolation features provided to separate various devices formed in the substrate 202. In one embodiment, shallow recess isolation (STI) features are used for lateral isolation. The various devices further include silicide disposed on S/D, gate and other device features for reduced contact resistance when coupled to output and input signals.

In an embodiment, the conductive feature 204 may be a source, drain or gate electrode of a transistor device. Alternatively, the conductive feature 204 may be a silicide feature disposed on a source, drain or gate electrode. The silicide feature may be formed by a self-aligned silicide (typically known as "silicide") technique. In another embodiment, the conductive feature 204 may include an electrode of a capacitor or one end of a resistor.

Figure 2B:
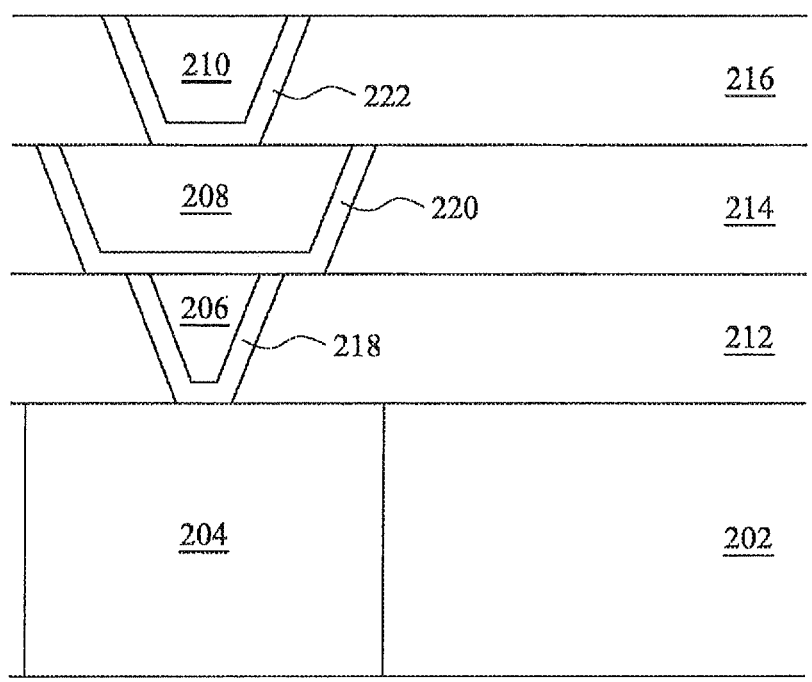

FIG. 2B is a cross-sectional view of the semiconductor device 200 including intermediate conductive structures 206, 208, 210 at one of the various stages of fabrication that corresponds to operation 104 of FIG. 1, in accordance with some embodiments. As introduced above, conductive structures may be interconnects for conductive features (active devices in the semiconductor device). Also, both conductive structures and conductive features may be generally referred to herein as conductive elements. The intermediate conductive structures may include vertical conductive structure(s) 206, 210 (e.g., vias) and horizontal conductive structure(s) 208 (e.g., conductive lines). For clarity, these intermediate conductive structures are described as "intermediate" because they are disposed between (and facilitate a conductive path between) the conductive feature 204 and a recess, as discussed in further detail below.

As shown, the intermediate vertical conductive structures 206, 210 may vertically extend through respective isolation layers 212, 216 to couple with other conductive elements, such as conductive feature 204 or intermediate horizontal conductive structure 208. Isolation layers 212, 216, and other isolation layers discussed below, may also be termed as dielectric layers. The isolation layers may form a non-conductive (e.g., dielectric) separation, or isolation, between conductive elements within the semiconductor device. Also, as will be discussed further below, intermediate horizontal conductive structure 208 may horizontally extend (e.g., over a respective width) through isolation layer 214 to couple with other conductive elements, such as intermediate vertical conductive structures 206, 210. In some embodiments, the intermediate horizontal conductive structure 208 may be wider than the intermediate vertical conductive structures 206, 210. In certain embodiments, the intermediate vertical conductive structure 206 adjacent to the conductive feature 204 may be a conductive plug. In some further embodiments, the semiconductor device 200 may include barrier layers 218, 220, 222 surrounding respective sidewalls and bottom surfaces of the intermediate conductive structures 206, 208, 210. For example, there may be no intermediate conductive structures in certain embodiments.

Although the semiconductor device 200 in the illustrated embodiment of FIG. 2B includes three intermediate conductive structures 210, 208, 206 within three isolation layers 216, 214, 212, it is understood that the illustrated embodiment of FIG. 2B and the following figures are merely provided for illustration purposes. Thus, the semiconductor device 200 may include any desired number of conductive structures within any desired number of isolation layers while remaining within the scope of the present disclosure.

The isolation layers may include a non-conductive material that is at least one of: silicon oxide, a low dielectric constant (low-k) material, other suitable dielectric material, or a combination thereof. The low-k material may include fluorinated silica glass (FSG), phosphosilicate glass (PSG), borophosphosilicate glass (BPSG), carbon doped silicon oxide ($SiO_xC_y$), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials.

In some embodiments, the intermediate conductive structures 210, 208, 206 may include conductive materials, such as a metal, or for example, copper (Cu), tungsten (W), or a combination thereof. In some other embodiments, the intermediate conductive structures 210, 208, 206 may include other suitable conductive materials (e.g., metal materials such as gold (Au), cobalt (Co), silver (Ag), etc. and/or conductive materials (e.g., polysilicon)) while remaining within the scope of the present disclosure.

In some embodiments, the barrier layers 218, 220, 222 may include barrier materials that enhance (e.g., improves) conductivity of conductive materials and may effectively prevent (e.g., block) metal atoms from diffusing from conductive materials into non-conductive materials during a deposition process to form conductive structures or conductive features. Examples of barrier materials include tantalum nitride (TaN), tantalum (Ta), titanium nitride (TiN), titanium (Ti), cobalt tungsten (CoW), tungsten nitride (WN), or the like.

In the following discussion, reference to conductive structures 206 and 208 may or may not include their corresponding barrier layers 218 and 220 as part of the respective conductive structure 206 and 208. In various embodiments, the barrier layer does not change the function of its respective adjoining conductive structure except to enhance the material properties of the adjoining conductive structures.

The intermediate vertical conductive structures 206, 210 may each be formed respectively by at least some of the following process steps: using chemical vapor deposition (CVD), physical vapor deposition (PVD), atomic layer deposition (ALD), spin-on coating, and/or other suitable techniques to deposit over (e.g., respectively over the substrate 202 and the conductive feature 204 or over the isolation layer 214 and the intermediate horizontal conductive structure 208) the non-conductive material to form an initial first isolation layer (the isolation layer is a remaining portion of the initial first isolation layer after the later performed patterning process); performing one or more patterning processes (e.g., a lithography process, a dry/wet etching process, a cleaning process, a soft/hard baking process, etc.) to form an opening through the initial first isolation layer; using CVD, PVD, ALD, and/or other suitable techniques to deposit the aforementioned barrier material along a bottom surface and sidewalls of the opening to surround the opening; using CVD, PVD, ALD, E-gun, and/or other suitable techniques to fill the opening with conductive material, and polishing out excessive material to form the intermediate vertical conductive structures 206, 210.

As shown, the intermediate horizontal conductive structure 208 horizontally extends over a respective width in the isolation layer 214. The intermediate horizontal conductive structure 208 may be conductively coupled to the intermediate vertical conductive structures 206, 210. The intermediate horizontal conductive structure 208 may be formed by at least some of the following process steps: using CVD, PVD, ALD, spin-on coating, and/or other suitable techniques to deposit non-conductive material over the layer 212 and the intermediate vertical conductive structure 206 to form an initial first isolation layer (the isolation layer 214 is a remaining portion of this initial first isolation layer after the later performed patterning process); performing one or more patterning processes (e.g., a lithography process, a dry/wet etching process, a cleaning process, a soft/hard baking process, etc.) to form an opening through the initial first isolation layer; using CVD, PVD, ALD, and/or other suitable techniques to deposit the aforementioned barrier material along a bottom surface and sidewalls of the opening to surround the opening; using CVD, PVD, ALD, E-gun, and/or other suitable techniques to fill the opening with conductive material, and polishing out excessive material to form the intermediate horizontal conductive structure 208.

Figure 2C:
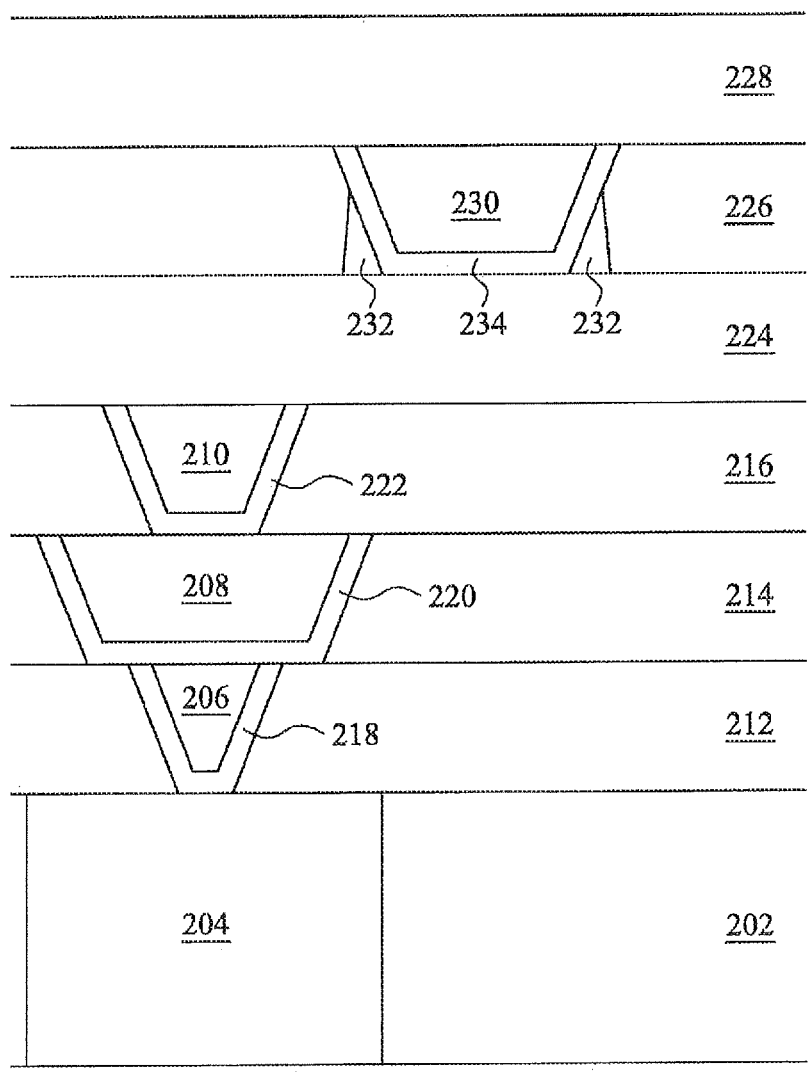

FIG. 2C is a cross-sectional view of the semiconductor device 200 including a lateral conductive structure 230 at one of the various stages of fabrication that corresponds to operation 106 of FIG. 1, in accordance with some embodiments. In some embodiments, the lateral conductive structure 230 may be a conductive line and may be a type of lateral conductive element (as discussed above). The lateral conductive structure 230 may be formed of the same (or different) conductive material as that of intermediate horizontal conductive structure 208. Also, the lateral conductive structure 230 may be surrounded along its bottom and sidewalls with a barrier layer 234 of the same (or different) barrier layer material as that of barrier layer 220 of intermediate horizontal conductive structure 208.

The lateral conductive structure 230 may be described as "lateral" due to being within an isolation layer 226 that the recess passes through, as discussed with respect to FIGS. 2D-2G below. Stated another way, the lateral conductive structure 230 may be displaced from a recess along a horizontal axis (as opposed to a vertical axis), or displaced laterally (as opposed to vertically) from the recess. The recess, and its orientation to the lateral conductive structure 230 will be discussed further below. In various embodiments, the lateral conductive structure 230 may be in conductive communication with a conductive feature such as a gate or an active device different than the conductive feature 204.

Spacers 232 may be formed to adjoin the lateral conductive structure 230. As introduced above, the spacers may be configured to space the lateral conductive structure from other conductive elements in the semiconductor device 200 (such that the lateral conductive structure is spaced from other conductive elements). However, these spacers may prove less effective and more difficult to fabricate as the distance between conductive elements becomes smaller, and as functional density (e.g., the number of conductive elements per chip area) increases.

In certain embodiments, the spacers 232 may be formed of a spacer material, which may be a non-conductive material. The non-conductive spacer material may be silicon mononitride (SiN), or other suitable non-conductive material to space and insulate conductive materials from each other, in accordance with various embodiments.

As shown, the lateral conductive structure 230 and adjoining spacers 232 may be formed in an isolation layer 226 that is sandwiched between isolation layers 228 and 224. As shown in FIG. 2C, the isolation layer 224 may be formed upon and overlay isolation layer 216. As discussed above, the isolation layers may form a non-conductive (e.g., dielectric) separation, or isolation, between conductive elements within the semiconductor device.

The horizontal conductive structure 230 and the spacers 232 may be formed by at least some of the following process steps: using CVD, PVD, ALD, spin-on coating, and/or other suitable techniques to deposit non-conductive material over the layer 224 to form an initial first isolation layer (the isolation layer 226 is a remaining portion of this initial first isolation layer after the later performed patterning process); performing one or more patterning processes (e.g., a lithography process, a dry/wet etching process, a cleaning process, a soft/hard baking process, etc.) to form an opening through the initial first isolation layer; using CVD, PVD, ALD, and/or other suitable techniques to deposit the aforementioned spacer material along a bottom surface and sidewalls of the opening to surround the opening; performing one or more patterning processes (e.g., a lithography process, a dry/wet etching process, a cleaning process, a soft/hard baking process, etc.) to pattern the spacer material to form the spacer 232; using CVD, PVD, ALD, and/or other suitable techniques to deposit the aforementioned barrier material along a bottom surface and sidewalls of the opening to surround the opening; using CVD, PVD, ALD, E-gun, and/or other suitable techniques to fill the opening with conductive material, and polishing out excessive material to form the horizontal conductive structure 230.

Figure 2D:
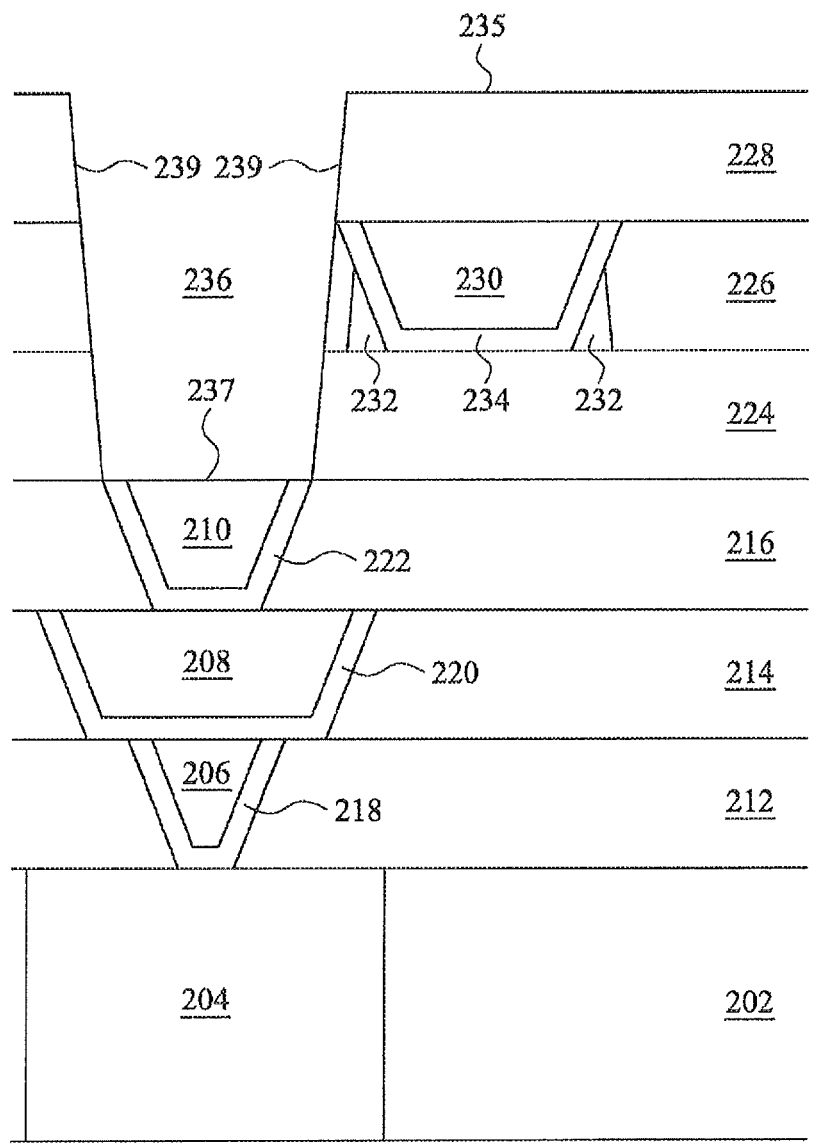

FIG. 2D is a cross-sectional view of the semiconductor device 200 including a recess 236 extending vertically across the isolation layers 224, 226, 228 at one of the various stages of fabrication that corresponds to operation 108 of FIG. 1, in accordance with some embodiments. As shown, the formation of the recess 236 exposes a portion of the top surface of intermediate vertical conductive structure 210 (at a bottom 237 of the recess). The recess 236 also has sidewalls 239 formed along the isolation layer 228, isolation layer 226, and isolation layer 224. Also, the recess 236 is exposed (i.e., opened) from the top surface 235 of the isolation layer 228.

In some embodiments, due to fabrication variations (such as over etching or misalignments during semiconductor processing of either the lateral conductive structure 230 or the recess 236), the formation of the recess 236 may expose part of the lateral conductive structure 230. In such embodiments, in addition to exposing part of the lateral conductive structure 230, the formation of the recess 236 may also expose part of the spacers 232. Accordingly, spacers 232 embedded in a semiconductor device 200 to adjoin (and space or protect) a lateral conductive structure 230 from undesirable short circuits would not be effective at spacing or protecting the lateral conductive structure 230 from conductive material deposited in an adjacent recess.

In some embodiments, the recess 236 may be formed by using a photoresist as a mask to perform one or more dry/wet etching processes to etch the recess 236 to reach down to a top surface of the intermediate vertical conductive structure 210 through isolation layers 228, 226 and 224. More specifically, in the embodiments in which the non-conductive material of the isolation layers 228, 226 and 224 include silicon oxide, the wet etching process to etch the isolation layers 228, 226 and 224 may be performed by using hydrofluoric acid or the like; and/or the dry etching process to etch the isolation layer 228, 226 and 224 may be performed by using etchant gases, for example, tetrafluoromethane ($CF_4$), fluoroform ($CHF_3$), difluoromethane ($CH_2F_2$), octafluorocyclobutane ($C_4F_8$), argon (Ar), and/or oxygen ($O_2$).

Figure 2E:
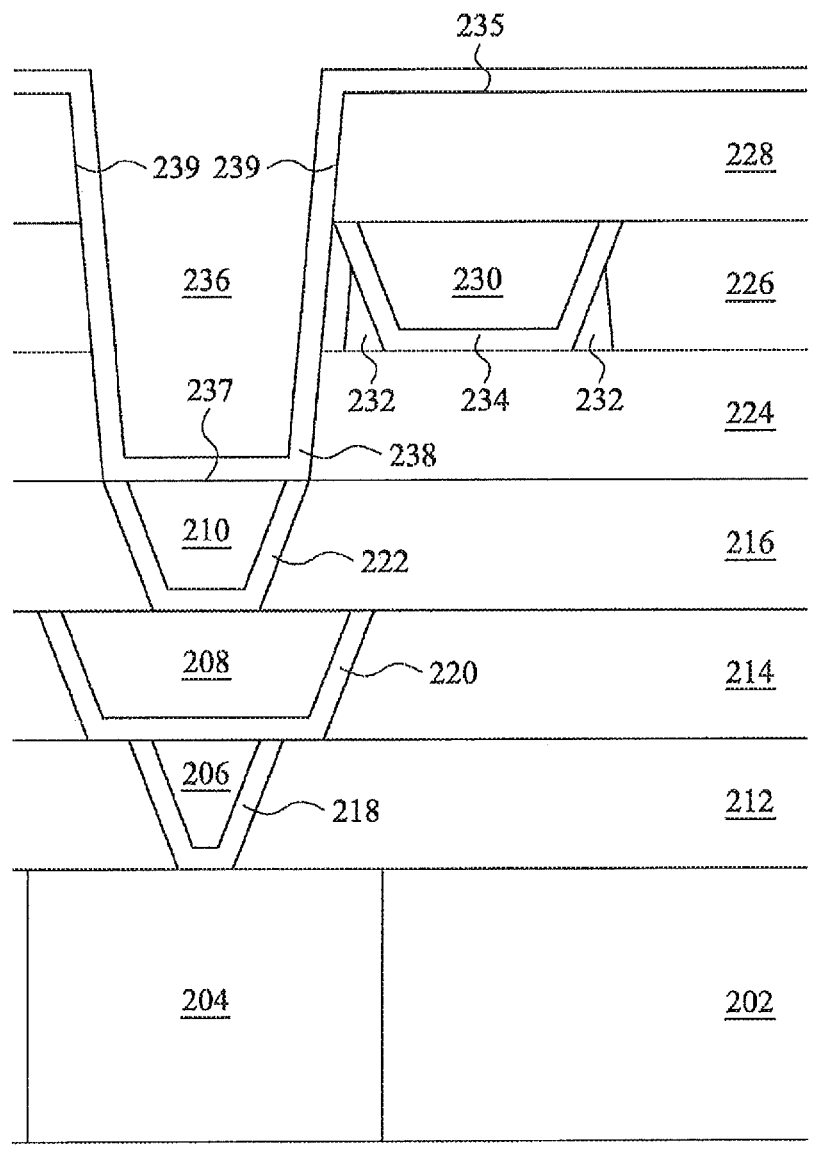

FIG. 2E is a cross-sectional view of the semiconductor device 200 including a conformal removable insulation layer 238 formed in the recess 236 at one of the various stages of fabrication that corresponds to operation 110 of FIG. 1, in accordance with some embodiments. As shown, the removable insulation layer 238 overlays the top surface 235 of the isolation layer 228 and surrounds the recess 236 (i.e., overlays the bottom 237 of the recess 236 and extends along the sidewalls 239 of the recess 236).

As discussed above, the removable insulation layer 238 may include a non-conductive material. Although the non-conductive materials of the removable insulation layer 238 and other layers (e.g., isolation layers 228, 226 and 224) through which the recess 236 is formed may be the same, or may be different, the non-conductive material of the removable insulation layer may be formed ad hoc when the recess 236 is formed. Accordingly, conductive material deposited in that recess 236 may be insulated by the non-conductive material of the removable insulation layer 238 even if the newly formed recess cuts through to (e.g., exposes) a conductive material of a lateral conductive element.

Also, as introduced above, the removable insulation layer 238 may be formed by exposing the recess to a transforming medium. The transforming medium may be a medium that forms the removable insulation layer on the surface of the recess (e.g., the sidewalls 239 and bottom 237 of the recess) in a conformal manner. In certain embodiments, the transforming medium may be a medium that reacts to residual oxide to form the removable insulation layer. For example, the residual oxide may be an oxide on the semiconductor device, such as an oxide from an isolation layer's non-conductive material (e.g., $SiOx$ where x is between 1~2), and the transforming medium may be $H_2$ plasma, that (upon being exposed to the residual oxide) reacts and produces the insulation layer as a conformal layer of $SiO_2$ along the recess.

Stated another way more specifically, in certain embodiments, the residual oxide may be $SiOx$ from the non-conductive material of the exposed isolation layers (e.g., isolation layer 228, isolation layer 226, or isolation layer 224). The transforming medium (e.g., $H_2$ plasma) may be applied to the residual oxide to form $Si+H_2O$. The $Si+H_2O$ with the addition of $H_2$ plasma may form $SiH_4$ (e.g., $SiOx+(2+x)H2 \leftrightarrow SiH4+xH2O$). The $SiH_4$, which may be in gaseous form, may react with the residual $H_2O$ to form $SiO_2 + H_2\cdot$, where the $SiO_2$ would react with the residual $H_2O$ to deposit conformably along the semiconductor device surface. Accordingly, the $SiO_2$ would be the non-conductive material formed conformally along the surface of the semiconductor device (e.g., along the recess sidewalls 239, the recess bottom 237, and along the top 235 of the isolation layer 228) to form the removable insulation layer 238. Also, the interface oxygen to work function metal ratio (e.g., oxygen:titanium or oxygen:tungsten) may be below 0.8 by adding $H_2$ plasma in-situ. This may be compared to using an Ar pre-clean only, where the interface oxygen to work function metal ratio (e.g., oxygen:titanium or oxygen:tungsten) may be at or above 0.8). Examples of work function metals may include titanium (Ti), tungsten (W), aluminum (Al), and the like. The oxygen to titanium ratio could be improved effectively by cleaning, in situ, with 100% H2 plasma.

In certain embodiments, the removable insulation layer may be about 10 angstroms (Å) to about 20 Å in thickness above the semiconductor device surface. However, other thicknesses are contemplated, such as from about 1 Å to about 100 Å to effectuate an non-conductive, insulating layer (e.g., insulation layer) effective between conductive elements for different applications in accordance with various embodiments. This thickness may be varied by supplying more of (or applying a greater concentration of) the transforming medium and/or by varying the time at which the transforming medium is applied to the semiconductor device. In some embodiments after the argon plasma bombardment, a bottom portion of the recess sidewall may have slightly thicker insulating material than at other portions of the recess sidewall (e.g., as compared to upper portions of the recess sidewall).

In certain embodiments, the removable insulation layer may be deposited (and as discussed below, removed) via plasma processing in a vacuum chamber in the presence of a plasma (i.e., an electrically neutral, highly ionized gas). In plasma processing, radio frequency (RF) generators may be used to ignite and maintain plasmas that may or may not be stable. These RF generators may react to (and compensate for) a plasma's changing characteristics for processing using the plasma.

In particular embodiments, the removable insulation layer may be deposited by varying $H_2$ plasma exposure times from about 40 seconds to about 60 seconds at about 100 degrees centigrade (° C.) to about 200 degrees ° C. The $H_2$ plasma may be generated using a primary RF generator (e.g., RF2) of about 800 watts (W) to about 900 W at about 1 megahertz (MHz) to about 3 MHz to ionize an $H_2$ gaseous source (at about 100% concentration). In some embodiments, the $H_2$ gaseous source may be provided at a flow rate of about 20 Standard Cubic Centimeters per Minute (SCCM) to about 100 SCCM. Simultaneously or subsequently, the $H_2$ plasma may be directed using a secondary RF generator (e.g., RF1) connected to the back of a substrate of about 100-150 W at about 12 MHz to about 15 MHz. This may be performed at total pressure of about 3 mtorr to about 6 mtorr. The direction of the plasma, as guided by the secondary RF generator (e.g., RF1), may be applied vertically upon the semiconductor device 200 to deposit (ie., form) the removable insulation layer 238.

Figure 2F:
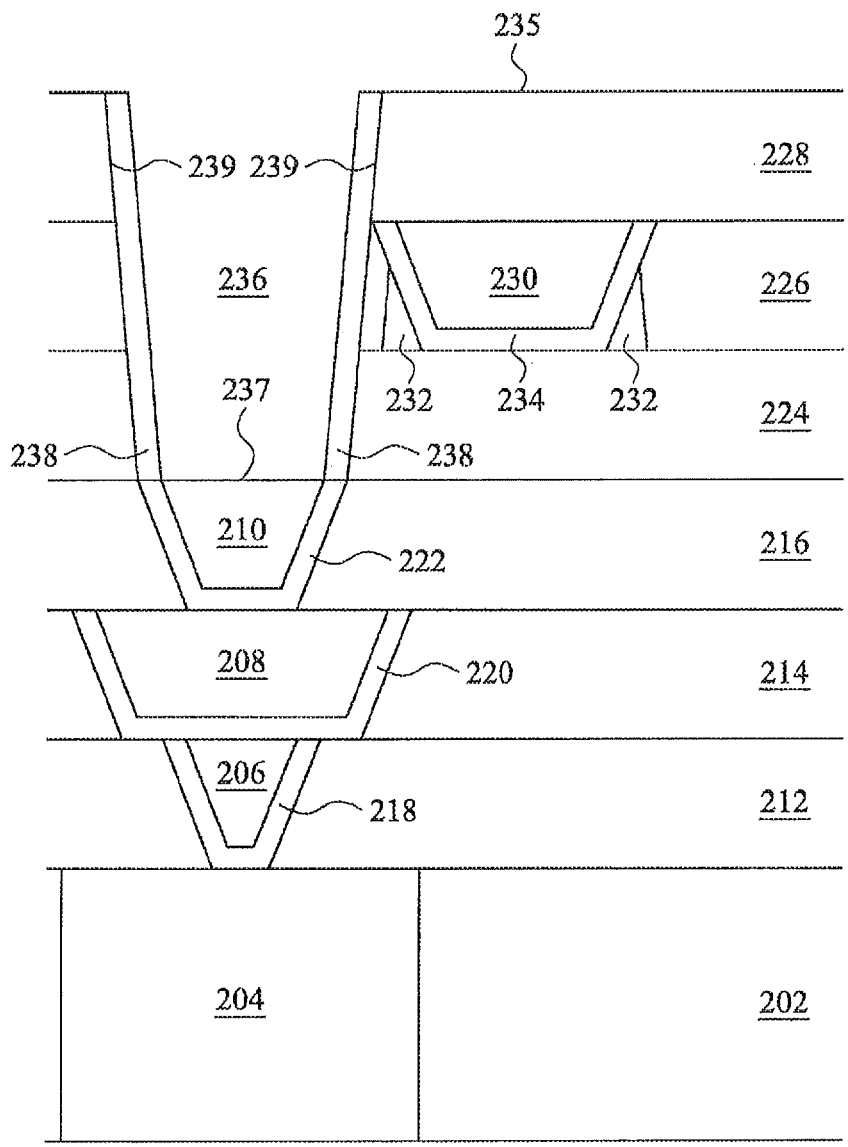

FIG. 2F is a cross-sectional view of the semiconductor device 200 including a patterned conformal removable insulation layer 238 at one of the various stages of fabrication that corresponds to operation 110 of FIG. 1, in accordance with some embodiments. As shown, the removable insulation layer 238 overlays the surface of the semiconductor device 200 and is patterned to only coat the sidewalls 239 of the opening in the semiconductor device 200 formed by the recess 236. Stated another way, a bottom portion 237 of the removable insulation layer 238 is removed and (optionally) a portion of the removable insulation layer 238 disposed on the top surface 235 of the isolation layer 228 may be removed.

As introduced above, the removable insulation layer 238 may be patterned by applying a removal process to the removable insulation layer 238. This removal process may include applying a removing medium, such as Argon (Ar) plasma, directionally upon portions of the removable insulation layer 238 that are present in FIG. 2E but removed in FIG. 2F. For example, the Ar plasma may be applied directionally, from above the removable insulation layer 238, to portions of the insulation layer for removal. This directional application may be performed by overlaying a mask to expose the portions of the removable insulation layer for removal and then applying the removing medium to the exposed insulation layer through the mask. Alternatively, the directional application may be performed by direct control of a removing medium expeller to direct the removable medium upon portions of the removable insulation layer 238 for removal (without using a mask).

Advantageously, the removable insulation layer 238 may be more easily removable than other types of traditional protective layers that may insulate conductive materials, such as traditional insulation layers composed of materials such as TiAl or TiN. For example, application of this removal process may remove the portions of the removable insulation layer 238 faster (greater quantity of material removal per unit time), more effectively (greater percentage of total material removal per unit time), or cheaply (cheaper operation costs per unit time) than traditional removal processes applied to other types of traditional protection layers that may insulate conductive materials.

In certain embodiments, the removable insulation layer may be removed by plasma processing, introduced above. Specifically, the removable insulation layer may be removed by applying Ar plasma generated at about 1 MHz to about 3 MhZ using a primary RF generator (e.g., RF2) with about 250 W to about 300 W. Simultaneously or subsequently, Ar gas may be directed at a flow rate of about 5 SCCM to about 20 SCCM at about 12 MHz to about 14 MHZ using a secondary RF generator (e.g., RF1) connected to the back of a substrate with about 400 to about 450 W. This may be performed at a total pressure of about 2 mtorr to about 3 mtorr. The direction of the plasma, as guided by the secondary RF generator (e.g., RF1), may be applied vertically upon the semiconductor device 200 to remove the removable insulation layer 238 from the bottom 237 of the recess 236 (and, optionally, at the top of the isolation layer 228).

Figure 2G:
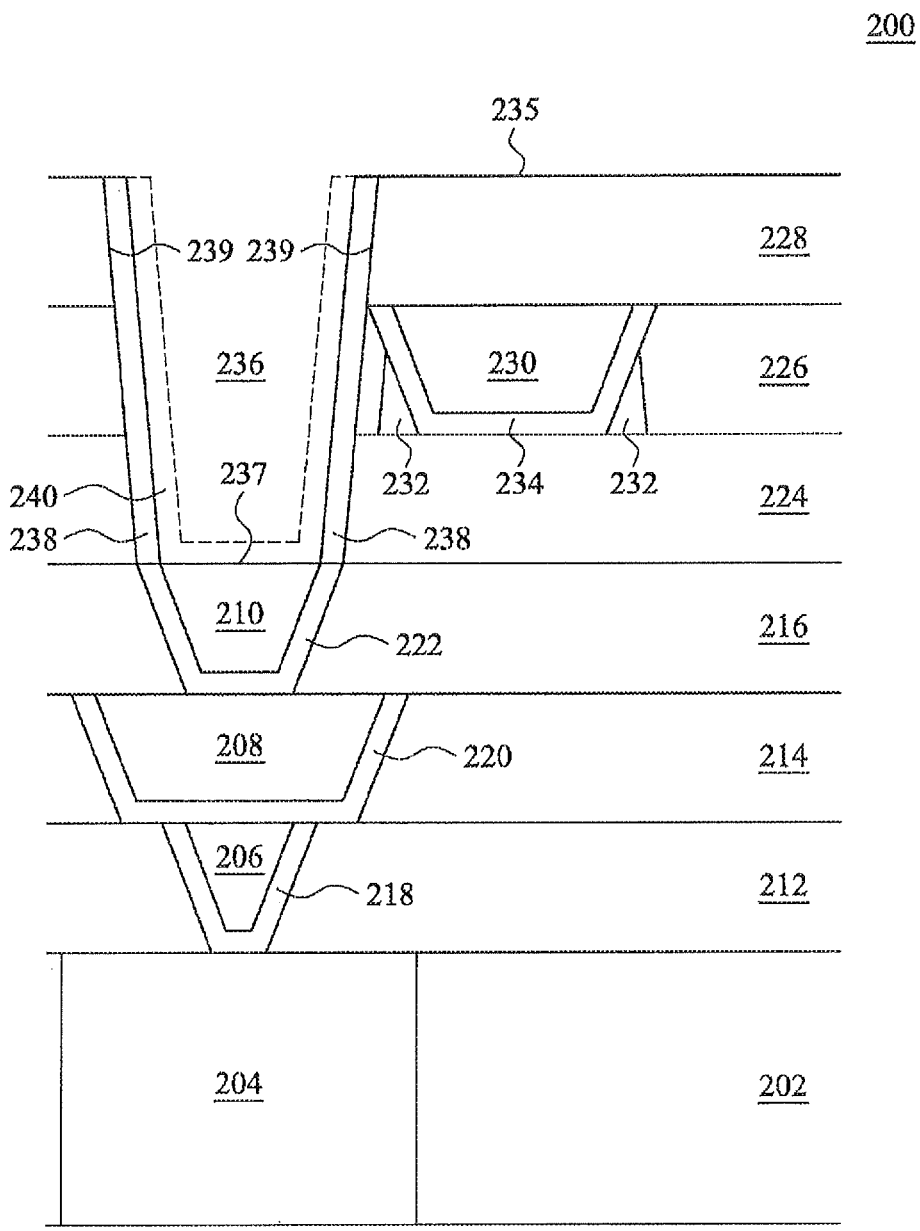

FIG. 2G is a cross-sectional view of the semiconductor device 200 including an optional barrier layer 240 at one of the various stages of fabrication that corresponds to operation 114 of FIG. 1, in accordance with some embodiments. As shown, the barrier layer 240 is formed along the opening formed by the recess 236.

As introduced above, the barrier layer 240 may include barrier materials that enhance conductivity of conductive materials and may effectively prevent metal atoms from diffusing from conductive materials into non-conductive materials during a deposition process to form conductive structures or conductive features. Examples of barrier materials include tantalum nitride (TaN), tantalum (Ta), titanium nitride (TiN), titanium (Ti), cobalt tungsten (CoW), tungsten nitride (WN), or the like. The barrier layer may be formed by using CVD, PVD, ALD, and/or other suitable techniques to deposit the aforementioned barrier material along a bottom surface and sidewalls of the opening to surround the opening.

Figure 2H:
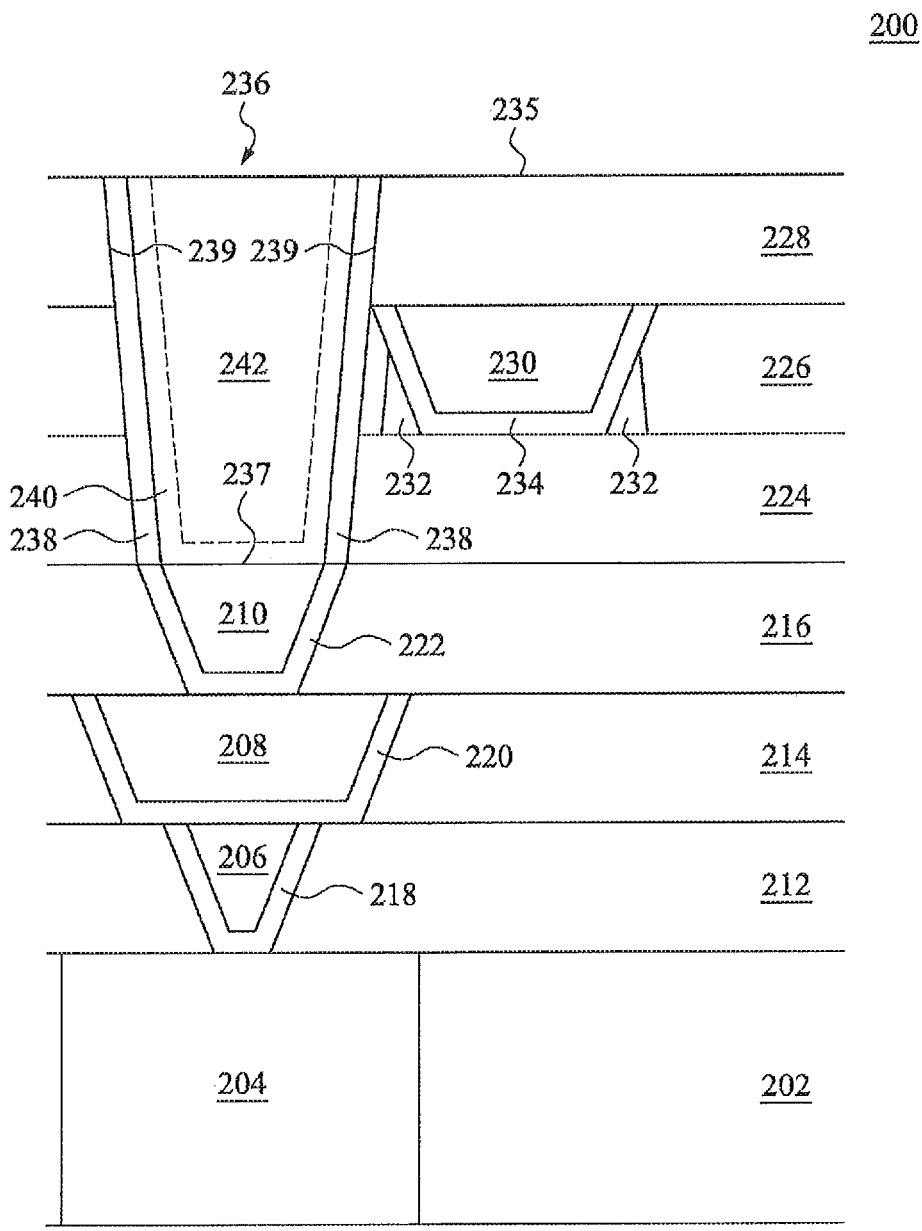

FIG. 2H is a cross-sectional view of the semiconductor device 200 including a deposition of conductive material to form a recess conductive structure 242 within the recess 236 at one of the various stages of fabrication that corresponds to operation 116 of FIG. 1, in accordance with some embodiments. As discussed above, the conductive materials may include non-metal conductive materials (e.g., polysilicon) and/or metal conductive materials, such as copper (Cu), tungsten (W), gold (Au), cobalt (Co), and silver (Ag). As shown, the recess 236 is filled with a conductive material to form a recess conductive structure 242 (e.g., a conductive structure within the recess 236). The recess conductive structure 242 may be in conductive communication with the conductive feature 204 through intermediate vertical conductive structure 210, intermediate horizontal conductive structure 208, and intermediate vertical conductive structure 206. The recess conductive structure 242 may be a vertical conductive structure, such as a via, that extends through isolation layers 228, 226 and 224. The recess conductive structure 242 may also be insulated (in virtue of the removable insulation layer 238 adjoining the sidewalls 239 of the recess 236) from the lateral conductive structure 230. Stated another way, the recess conductive structure 242 would be shorted with the lateral conductive structure 230 but for the removable insulation layer 238.

In certain embodiments, the recess conductive structure 242 may be formed using CVD, PVD, ALD, E-gun, and/or other suitable techniques to fill the remaining opening formed by the recess 236 in FIG. 2G on top of the barrier layer 240 with conductive material, and polishing out excessive material to form the recess conductive structure 242 of FIG. 2H.

Figure 3:
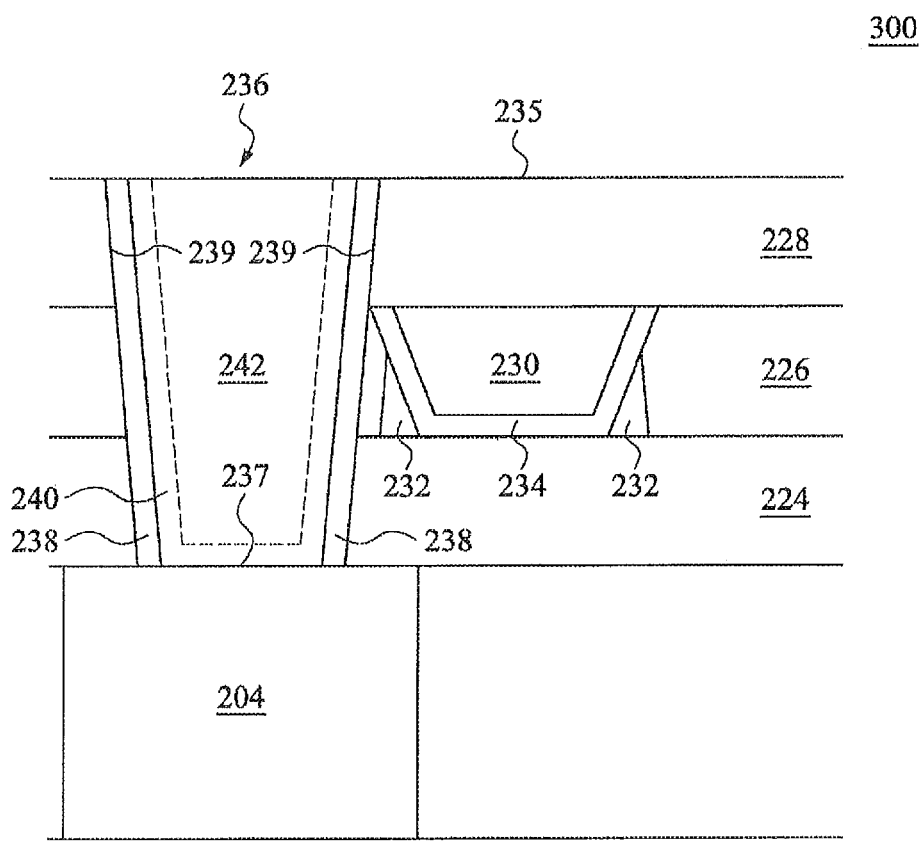
FIG. 3 is a cross-sectional view of a semiconductor device with the recess conductive structure directly in contact with the conductive feature, in accordance with some embodiments.

FIG. 3 is a cross-sectional view of a semiconductor device 300 with the recess conductive structure 242 within the recess 236 directly in contact with the conductive feature 204, in accordance with some embodiments. As introduced above, there may be no intermediate conductive structures between the recess 242 and the conductive feature 204 in certain embodiments. Accordingly, the recess conductive structure 242 may be in direct conductive communication with the conductive feature 204. The various components and stages of fabrication of the embodiment where the recess conductive structure 242 is in direct contact with the conductive feature 204 are similar to that as discussed above, except that the intermediate conductive structures, for example as discussed above in connection with FIG. 2B, are not between the recess 242 and the conductive feature 204. Accordingly, The various components and stages of fabrication of the embodiment where the recess conductive structure 242 is in direct contact with the conductive feature 204 will not be repeated here for brevity.

In an embodiment, a semiconductor device includes: a first conductive structure having sidewalls and a bottom surface, the first conductive structure extending through one or more isolation layers formed on a substrate; and an insulation layer disposed between at least one of the sidewalls of the first conductive structure and respective sidewalls of the one or more isolation layers, wherein the first conductive structure is electrically coupled to a second conductive structure through at least the bottom surface.

In another embodiment, a method of manufacturing an insulation includes: depositing a first layer; etching the first layer to form a recess extending through the first layer; depositing the insulation layer over the recess, the insulation layer comprising a non-conductive material; and removing a portion of the insulation layer from a bottom of the recess.

Yet in another embodiment, a method includes: forming a first layer; forming a second layer overlaying the first layer; forming a third layer overlaying the second layer; forming a recess that extends through the first, second, and third layers; forming an insulation layer over the recess, the insulation layer comprising a non-conductive material; and removing the insulation layer from a bottom of the recess.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. A method of making a semiconductor device, comprising:
   forming one or more isolation layers on a substrate;
   forming a first conductive structure extending vertically through the one or more isolation layers, the first conductive structure having sidewalls and a bottom surface;
   forming an insulation layer along the sidewalls of the one or more isolation layers; and
   forming a barrier layer along sidewalls of the insulation layer such that the insulation layer is disposed between the barrier layer and the sidewalls of the one or more isolation layers,
   wherein the barrier layer comprises a work function metal, wherein the first conductive structure is electrically coupled to a second conductive structure through at least the bottom surface, and wherein the insulation layer provides an interface oxygen to work function metal ratio of below 0.8.

2. The method of claim 1, wherein the first conductive structure comprises a via extending through the insulation layer.

3. The method of claim 1, further comprising:
   forming a spacer adjoining a lateral conductive structure disposed at one of the one or more isolation layers, wherein the spacer is between the lateral conductive structure and the insulation layer.

4. The method of claim 3, wherein the spacer is spaced from the insulation layer.

5. The method of claim 3, wherein the lateral conductive structure is a conductive line.

6. The method of claim 3, wherein the insulation layer abuts the lateral conductive structure.

7. The method of claim 1, wherein the first conductive structure and the second conductive structure comprise vias.

8. A method of making a semiconductor device, comprising:
   forming one or more isolations layers on a substrate;
   forming a first conductive structure vertically extending through the one or more isolation layers;
   forming an insulation layer along sidewalls of the one or more isolation layers, wherein the insulation layer is further disposed between a bottom surface of the first conductive structure and a top surface of a second conductive structure, and wherein the insulation layer comprises oxygen and provides an interface oxygen to work function metal ratio of below 0.8; and forming a barrier layer disposed along sidewalls and a bottom wall of the insulation layer such that the sidewalls of the insulation layer are disposed between the barrier layer and the sidewalls of the first conductive structure, and the bottom wall of the insulation layer is disposed between a bottom wall of the barrier layer and the top surface of the second conductive structure, and wherein the barrier layer comprises a work function metal.

9. The method of claim 8, wherein the first conductive structure comprises a via extending through the insulation layer.

10. The method of claim 8, further comprising:
forming a spacer adjoining a lateral conductive structure disposed at one of the one or more isolation layers, wherein the spacer is between the lateral conductive structure and the insulation layer.

11. The method of claim 10, wherein the spacer is spaced from the insulation layer.

12. The method of claim 10, wherein the lateral conductive structure is a conductive line.

13. The method of claim 10, wherein the insulation layer abuts the lateral conductive structure.

14. The method of claim 8, wherein the first conductive structure comprises a via.

15. The method of claim 8, wherein the work function metal comprises one of: titanium, tungsten, and aluminum.

16. A method of making a semiconductor device, comprising:
forming a first isolation layer on a substrate;
forming a second isolation layer over the first isolation layer;
forming a recess that extends through the first and second isolation layers;
forming a conductive structure in the recess;
forming an insulation layer along sidewalls of the first and second isolation layers; and
forming a barrier layer along sidewalls of the insulation layer, wherein the barrier layer comprises a work function metal, and wherein the insulation layer comprises oxygen and provides an interface oxygen to work function metal ratio of below 0.8.

17. The method of claim 16, further comprising:
forming a lateral conductive structure within the second layer, wherein the lateral conductive structure is in contact with the insulation layer; and
forming a conductive material located within the recess.

18. The method of claim 16, wherein the insulation layer comprises $SiO_2$.

19. The method of claim 16, wherein the conductive structure comprises a via.

20. The method of claim 16, wherein the work function metal comprises one of: titanium, tungsten, and aluminum.

* * * * *